United States Patent [19]

Gehring

[11] Patent Number: 4,481,479
[45] Date of Patent: Nov. 6, 1984

[54] NEGATIVE-FEEDBACK CIRCUIT FOR AN, ESPECIALLY INTEGRATED, TRANSISTOR AMPLIFIER

[75] Inventor: Gerhard Gehring, Unterhaching, Fed. Rep. of Germany

[73] Assignee: Siemens Aktiengesellschaft, Berlin and Munich, Fed. Rep. of Germany

[21] Appl. No.: 298,777

[22] Filed: Sep. 2, 1981

[30] Foreign Application Priority Data

Sep. 30, 1980 [DE] Fed. Rep. of Germany ....... 3036887

[51] Int. Cl.$^3$ .......................... H03F 3/26; H03F 1/34
[52] U.S. Cl. ..................................... 330/265; 330/291
[58] Field of Search ................ 330/262, 265, 291, 260

[56] References Cited

U.S. PATENT DOCUMENTS 3,778,730 12/1973 Cromwell et al. .................. 330/265
4,187,472 2/1980 Yum .................................... 330/260

Primary Examiner—James B. Mullins
Assistant Examiner—G. Wan
Attorney, Agent, or Firm—Herbert L. Lerner; Laurence A. Greenberg

[57] ABSTRACT

Negative-feedback circuit for a transistor amplifier having an output stage, an output transformer being operated by the output stage and having a center tap and two ends, the center tap being connected to a supply voltage source, a first output transistor connected to one of the two ends of the transformer and a second output transistor connected to the other end of the transformer, each of the output transistors being driven by a half wave of an information signal and being load carrying during that respective half-wave only, including two circuits, one being connected to the first output transistor and the other being connected to the second output transistor for imaging the current in the output circuit of the output transistors connected thereto, and a circuit branch connected to the imaging circuits for combining the currents flowing in the imaging circuits into a full-wave voltage signal for negative-feedback.

6 Claims, 2 Drawing Figures

NEGATIVE FEEDBACK TO AMPLIFIER INPUT

NEGATIVE FEEDBACK TO AMPLIFIER INPUT

NEGATIVE-FEEDBACK CIRCUIT FOR AN, ESPECIALLY INTEGRATED, TRANSISTOR AMPLIFIER

The present invention relates to a negative-feedback circuit for an, especially integrated, transistor amplifier having an output stage operating an output transformer provided with a center tap, the center tap of the output transformer being connected to a supply voltage and each end of the output transformer being coupled to an output transistor each being driven by a half-wave of an information signal and carrying load current during the respective half-wave only.

Heavily inductive loads such as headsets and transformers represent considerable problems concerning the ability of amplifiers to be negatively feed back, if the negative-feedback signal must be taken off such an inductive load. This is because considerable additional phase shifts will result so that the phase relations, in most cases, become very opaque, e.g. because of multiple natural resonances.

This applies, in particular, to push-pull output stages of headsets, for example. The efficiency of push-pull output stages is much higher than that of single-ended output stages. In headsets, however, the usual push-pull output stages in the form of a pnp/npn transistor combination are out of the question because such circuits require a 1.7 V minimum battery voltage.

Therefore, tapped headsets and two transistors of the same conduction or conductivity type are used as output stages, each being coupled to one end of the load transformer. The information signal is processed in such a way that each output transistor is driven by one half-wave of the information signal, therefore carrying current during one half-wave only. The full-wave signal reappears only in the headset or in the transmitter because both branches are coupled magnetically.

In circuits of this type, constructed with discrete circuit elements, the components have been selected, measured, balanced in part, and in most cases, operated with an internal negative-feedback by an emitter resistance in the heretofore usual manner. However, this more or less reduces the driving range of the transistor amplifier output stage.

It is accordingly an object to the invention to provide a negative-feedback circuit for transistor amplifiers, especially an integrated one, which overcomes the hereinafore-mentioned disadvantages of the heretofore-known devices of this general type, and which avoids the above-mentioned reduction of the driving range of the output stage.

With the foregoing and other objects in view there is provided, in accordance with the invention, a negative-feedback circuit for a transistor amplifier, especially an integrated one, having an output stage, an output transformer being operated by the output stage and having a center tap and two ends, the center tap being connected to a supply voltage source, a first output transistor connected to one of the two ends of the transformer and a second output transistor connected to the other end of the transformer, each of the output transistors being driven by a half wave of an information signal and being load carrying during that respective half-wave only, comprising two circuits, one being connected to the first output transistor and the other being connected to the second output transistor for imaging the current in the output circuit of the output transistors connected thereto, and a circuit branch connected to the imaging circuits for combining the currents flowing in the imaging circuits into a full-wave voltage signal for negative-feedback.

In accordance with another feature of the invention, the circuit branch is a voltage divider.

In accordance with a further feature of the invention, the circuit branch is in the form of a resistor and a current source.

In accordance with an added feature of the invention, each of the imaging circuits is in the form of a sampling transistor stage driven by the base-emitter voltage of the output transistors connected thereto, and including a current mirror connected to one of the sampling transistor stages providing a sign reversal for generation of the full-wave voltage signal.

In accordance with an additional feature of the invention, there is provided an integrated-technology semiconductor crystal containing the output transistors, each of the sampling transistor stages being in the form of a transistor being operated in a common-emitter circuit in the crystal in immediate proximity of the output transistor associated therewith.

In accordance with a concomitant feature of the invention, there are provided two resistors each being connected in the emitter circuit of one of the sampling transistors.

Other features which are considered as characteristic for the invention are set forth in the appended claims.

Although the invention is illustrated and described herein as embodied in negative-feedback circuit for an, especially integrated, transistor amplifier, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawings, in which.

DETAILED DESCRIPTION OF THE EMBODIMENT

Figure 1:
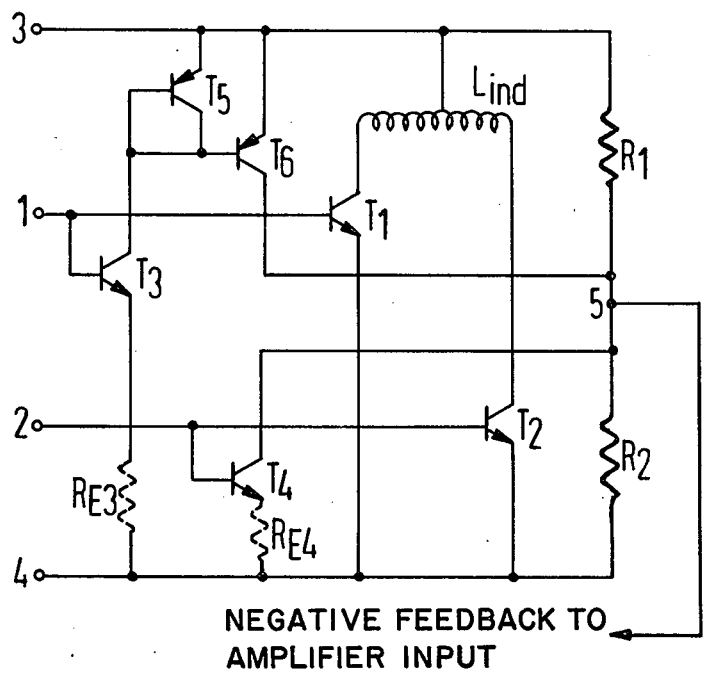
FIG. 1 is a schematic circuit diagram of one embodiment of a transistor amplifier output stage with a negative-feedback circuit according to the invention.

Referring now to the figures of the drawing and first particularly to FIG. 1 thereof, it is seen that an output stage of a transistor amplifier, the preceding stages of which may be of conventional construction and are therefore not shown, is formed by output transistors $T_1$ and $T_2$. These output transistors $T_1$ and $T_2$ are each coupled to one end of an inductive load $L_{ind}$ which is provided with a center tap and may be formed, for instance, by the receiver of a headset or by a transformer. The output stage transistors $T_1$ and $T_2$ are each driven at terminals 1 and 2 of the non-illustrated amplifier stages, by a half-wave of an information signal. At terminals 3 and 4, the circuit is supplied with supply voltage, terminal 3 carrying a positive supply voltage and terminal 4 being at reference potential (ground).

To generate a negative-feedback signal, the base-emitter voltage of the output transistors $T_1$ and $T_2$ is first picked up by a sampling or current imaging transistor $T_3$ and $T_4$, respectively. This is based on the fact that the base-emitter voltage of the output transistors $T_1$ and $T_2$ is a function of the output current and increases logarithmically therewith. Therefore, information on the output current that is actually flowing is available at the base-emitter path of the output transistors without having to intervene in the load circuit or change the impedance conditions in the load circuit, such as by emitter resistors.

This pick-up or evaluation of the base-emitter voltage of the output transistors $T_1$ and $T_2$ is particularly simple in integrated circuits. If the sampling transistors $T_3$ and $T_4$ are disposed in the same semiconductor crystal in the immediate proximity of the respective output transistor $T_1$ and $T_2$, respectively, according to a spacial feature of the invention, the sampling transistors will furnish the same current as the output transistors $T_1$ and $T_2$, provided the geometry and the base-emitter voltage are the same. With smaller sampling transistor dimensions relative to the output transistors, the current is smaller by a defined factor.

When the currents in the output transistors $T_1$ and $T_2$ are sampled or picked up in the manner described above, an exact image of the output currents, without voltage drops at emitter resistors, can be obtained with all distortions caused by the inductive load $L_{ind}$. This can then be utilized for a negative-feedback to improve the linearity, without touching on the phase problems due to the inductive load.

In a push-pull output stage of the kind described herein with an inductive load $L_{ind}$ having a center tap, it is necessary, however, to first combine the two half-waves of the information signal into a full-wave information signal again. The current flowing in the sampling transistor $T_3$ and imaging one half-wave is first mirrored on the positive supply or battery voltage at terminal 3 in a current mirror formed by transistors $T_5$ and $T_6$ and then fed into a branch formed by a voltage divider $R_1$ and $R_2$, whereas the current in the transistor $T_4$, forming the other half-wave of the information signal, is fed directly into this branch. In the branch $R_1$, $R_2$ these currents are combined into a full-wave voltage signal for the negative-feedback. This signal can be taken off at a point 5 and fed in a conventional and therefore non-illustrated manner to the amplifier input for negative feedback.

If the signal current formed by the information signal increases during the first half-wave, the signal voltage or negative-feedback voltage at point 5 also increases, i.e. in the positive direction at the tap of the voltage divider $R_1$, $R_2$. On the other hand, if the current increases during the second half-wave of the information signal in the other output stage, the voltage at the tap 5 drops in the negative direction. Consequently, a full-wave voltage signal is formed at the point 5 on which a dc voltage is superposed and drops at the voltage divider as part of the battery voltage according to the resistance ratio of the voltage divider.

Therefore, the full-wave voltage signal, representing an exact copy of the output currents, can be taken off at the point 5 for the negative-feedback of the push-pull amplifier without interference by a headset or transmitter forming the inductive load $L_{ind}$.

To regain the full-wave voltage signal it is not absolutely necessary to use a voltage divider according to FIG. 1. Rather, it suffices to work with a single resistor.

Figure 2:
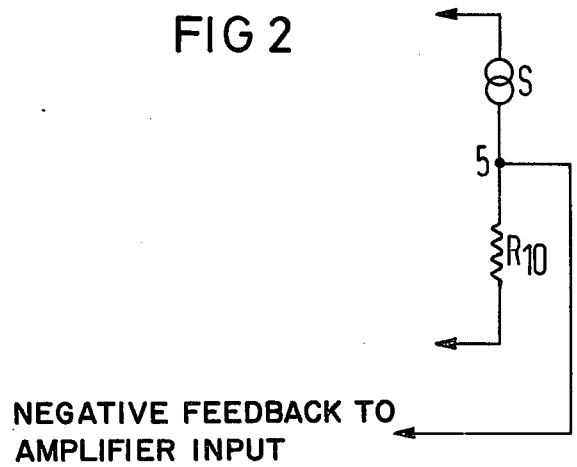
FIG. 2 is a schematic circuit diagram of a modified embodiment of a portion of the circuit according to FIG. 1.

Such a possibility is shown in FIG. 2, which illustrates a circuit component replacing the voltage divider $R_1$, $R_2$ of FIG. 1. The dc voltage level required at a single resistor $R_{10}$ according to FIG. 2, to ensure that the negative half-wave of the information signal can also be driven, is produced as a voltage drop due to a constant current which is furnished by a constant-current source S and supplied by the positive battery voltage (terminal 3 in FIG. 1). In this case, the dc voltage level is independent of the supply voltage.

In the practical embodiment of the above-described and illustrated circuit arrangement, emitter resistors $R_{E3}$, $R_{E4}$ shown in FIG. 1 may further be be provided, according to a further development of the invention. This is done as compensation for the path resistances of the output transistors $T_1$ and $T_2$ which produce a slightly increased emitter voltage. These small emitter resistors $R_{E3}$ and $R_{E4}$ are not absolutely required, and are accordingly shown in broken lines.

There are claimed:

1. Negative-feedback circuit for a transistor amplifier having an output stage, an output transformer being operated by the output stage and having a center tap and two ends, the center tap being connected to a supply voltage source, a first output transistor connected to one of the two ends of the transformer and a second output transistor connected to the other end of the transformer, each of said output transistors being driven by a half wave of an information signal and being load carrying during that respective half-wave only, and each of said output transistors having a collector-emitter path and a base, comprising two imaging circuits, one being connected to the base of the first output transistor and the other being connected to the base of the second output transistor so that each of said imaging circuits carries a current which is substantially the equivalent of the current flowing in the collector-emitter path of a respective one of said output transistors connected thereto, and a circuit branch connected to said imaging circuits for combining the current flowing in said imaging circuits into a full-wave voltage signal for negative-feedback.

2. Circuit according to claim 1, wherein said circuit branch is a voltage divider.

3. Circuit according to claim 1, wherein said circuit branch is in the form of a resistor and a current source.

4. Circuit according to claim 1, wherein each of said imaging circuits is in the form of a sampling transistor stage driven by the base-emitter voltage of the output transistors connected thereto, and including a current mirror connected to one of said sampling transistor stages providing sign reversal for generation of the full-wave voltage signal.

5. Circuit according to claim 4, including an integrated-technology semiconductor crystal containing the output transistors, each of said sampling transistor stages being in the form of a transistor being operated in a common-emitter circuit in said crystal in vicinity of the output transistor associated therewith.

6. Circuit according to claim 4, including two resistors each being connected in the emitter circuit of one of said sampling transistors.

* * * * *